(12) United States Patent
Lenchenkov

(10) Patent No.: US 12,382,742 B2
(45) Date of Patent: Aug. 5, 2025

(54) METHOD AND SYSTEMS OF IMAGE SENSORS WITH PIXELS HAVING CIRCULAR POLARIZERS

(71) Applicant: OmniVision Technologies, Inc., Santa Clara, CA (US)

(72) Inventor: Victor Lenchenkov, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 604 days.

(21) Appl. No.: 17/713,058

(22) Filed: Apr. 4, 2022

(65) Prior Publication Data

US 2023/0317752 A1    Oct. 5, 2023

(51) Int. Cl.
| | |
|---|---|
| *G02B 5/30* | (2006.01) |
| *G02B 5/18* | (2006.01) |
| *H04N 23/71* | (2023.01) |
| *H04N 23/74* | (2023.01) |
| *H10F 39/00* | (2025.01) |
| *H10F 39/18* | (2025.01) |

(52) U.S. Cl.
CPC ......... *H10F 39/806* (2025.01); *G02B 5/1814* (2013.01); *G02B 5/3058* (2013.01); *H04N 23/71* (2023.01); *H04N 23/74* (2023.01); *H10F 39/18* (2025.01); *G02B 2207/101* (2013.01)

(58) Field of Classification Search
CPC ........ H01L 27/14625; H01L 27/14643; G02B 5/1814; G02B 5/3058; G02B 2207/101; H04N 23/71; H04N 23/74
USPC .................................... 359/485.05, 485.03
See application file for complete search history.

(56) References Cited

U.S. PATENT DOCUMENTS

| | | | | |
|---|---|---|---|---|
| 2006/0227422 | A1* | 10/2006 | Monacelli | G02B 27/286 |
| | | | | 359/487.03 |
| 2009/0087192 | A1* | 4/2009 | Leard | B82Y 20/00 |
| | | | | 398/152 |
| 2013/0043956 | A1* | 2/2013 | Salit | G04F 5/14 |
| | | | | 427/163.1 |
| 2021/0203824 | A1* | 7/2021 | Lee | H04N 23/75 |

FOREIGN PATENT DOCUMENTS

CN         105403944 A  *  3/2016  .......... G02B 5/3058

OTHER PUBLICATIONS

Gansel et al; "Gold Helix Photonic Metamaterial as Broadband Circular Polarizer"; 2009; www.sceincemag.org; Science; vol. 325; pp. 1513-1515.*

(Continued)

*Primary Examiner* — Ricky D Shafer
(74) *Attorney, Agent, or Firm* — COZEN O'CONNOR

(57) ABSTRACT

An image sensor has an array of a tiling pattern of cells, each cell having at least one spiral nanowire circular polarizer formed of nanowires less than 80 nanometers in width; and photodiodes to receive incoming light form the circular polarizer. In embodiments, the polarizer is a descending spiral circular polarizer including at least four nanowires each about fifty nanometers wide at successive levels in the polarizer. In other embodiments, the circular polarizer comprises a flat spiral nanowire of width about seventy nanometers width, the flat spiral nanowire interrupted by cuts, disposed over multiple photodiodes to analyze a diffraction pattern from the polarizer.

14 Claims, 8 Drawing Sheets

(56) References Cited

OTHER PUBLICATIONS

Louie et al., "Degree of optical polarization as a tool for detecting melanoma: proof of principle", Journal of Biomedical Optics, col. 23 (12), Dec. 2018, 8 pages.
Novikova et al., Polarimetric Imaging for Cancer Diagnosis and Staging, Optics & Photonics News, Oct. 2012, 8 pages.
Qi et al., "Mueller polarimetric imaging for surgical and diagnostic applications: a review", 32 pages.
Rahman et al., "Circular Dichroism Spectroscopy: A Facile Approach for Quantitative Analysis of Captopril and Study of Its Degradation" ACS Omega, 4, 2019, pp. 4252-4258.
Held-Warmkessel, et al. "Lactic Acidosis in Patients With Cancer", Clinical Journal of Oncology Nursing, vol. 18, No. 5, 4 pages.

* cited by examiner

| QPD Sub-pixel photodiode | Simulated sub-pixel Photodiode Signals, S Polarization state | | | | | |
|---|---|---|---|---|---|---|
| | 90 | 0 | -45 | 45 | L | R |
| 1 | 0.001624 | 0.005501 | 0.008476 | 0.00219 | 0.005237 | 0.002988 |
| 2 | 0.001063 | 0.004226 | 0.005603 | 0.002242 | 0.004705 | 0.003818 |
| 3 | 0.001431 | 0.003004 | 0.005445 | 0.002556 | 0.002914 | 0.003469 |
| 4 | 0.001514 | 0.006815 | 0.010663 | 0.002497 | 0.006606 | 0.003219 |

| Sum of Sub-pixel photodiode Signal Ratios | 90 | 0 | -45 | 45 | L | R |
|---|---|---|---|---|---|---|
| 1/4+2/4+3/4 | 2.7 | 1.8 | 1.8 | 2.8 | 1.9 | 3.2 |
| 1/3+2/3+2/3 | 2.9 | 5.5 | 4.5 | 2.7 | 5.7 | 2.9 |
| 1/2 + 3/2+4/2 | 4.3 | 3.6 | 4.4 | 3.2 | 3.1 | 2.5 |

Fig. 10

Circular Polarized counter clock-wise L

METHOD AND SYSTEMS OF IMAGE SENSORS WITH PIXELS HAVING CIRCULAR POLARIZERS

BACKGROUND

Some minerals and many biological tissues reflect or transmit polarized light with a change in polarization. Imaging these materials with polarizing microscopes or cameras under polarized light can provide useful information as to mineral content of rocks, organelle types, and tissue types. In particular, this information can assist in differentiating minerals from adjacent minerals of similar coloration, and tissues from similar nearby or adjacent tissue types.

For example, it is believed that melanoma and some other cancerous tissues may appear different than nearby normal tissues when viewed with a polarizing microscope or camera under polarized illumination. Such differences can lead to improved contrast between the normal and cancerous tissues and aid physicians in both diagnosis and determining what and how much tissue to remove during surgical treatment of such cancerous tissues. It is also possible to distinguish some mammalian tissues from artificial materials by imaging through polarizing filters under polarized light, for example a human finger may be distinguished from a silicone replica finger.

It is also known that glare light reflected at shallow angles from water or highways can become polarized, some drivers are known to use polarizing sunglasses when driving in high-glare conditions.

Image sensors able to resolve polarization, and in some applications to resolve colors, as well as polarization in images, are therefore believed to have a large potential market.

Polarized light received from a scene may be linearly polarized in a vertical, horizontal, or diagonal axis, or circularly polarized either with left or right rotation; polarized light is sometimes represented according to a Stokes vector. Determining a Stokes vector of light returned by an object, or light passing through an object, and a Stokes vector of incident light, can permit determining a Mueller transformation matrix of the object and thus allow distinguishing tumor from normal tissue or a human finger from a silicone replica finger.

SUMMARY

In an embodiment, an image sensor has an array of a tiling pattern of cells, each cell having at least one spiral nanowire circular polarizer formed of nanowires less than 80 nanometers in width; and photodiodes to receive incoming light form the circular polarizer. In embodiments, the polarizer is a descending spiral circular polarizer including at least four nanowires each about fifty nanometers wide at successive levels in the polarizer. In other embodiments, the circular polarizer comprises a flat spiral nanowire of width about seventy nanometers, the flat spiral nanowire interrupted by cuts, disposed over multiple photodiodes to analyze a diffraction pattern from the polarizer.

In another embodiment, a method of imaging an object includes passing light from the object through a spiral nanowire circular polarizer, the spiral nanowire polarizer comprising nanowires less than eighty nanometers wide; receiving the light from the object into photodiodes of an image sensor to generate an electronic image; and processing the electronic image into an image representing polarization of the light from the object. In embodiments, the spiral nanowire circular polarizer is a descending spiral circular polarizer has at least one spiral of four nanowires each about fifty nanometers wide, each of the four nanowires at a successive level in the descending spiral circular polarizer. In other embodiments, the spiral nanowire circular polarizer has a flat spiral nanowire of width about seventy nanometers, the flat spiral nanowire being interrupted by cuts.

BRIEF DESCRIPTION OF THE FIGURES

FIG. 10 is an illustration of ratios, and totals, of signals received by four photodiodes in an array of four photodiodes resembling the embodiment of FIG. 6.

DETAILED DESCRIPTION OF THE EMBODIMENTS

In modern digital cameras/smart phones, image sensors capture and convert a real scene into a cameras' raw-RGB signals called scene-referred data. The raw-RGB signals are then processed by a dedicated hardware/firmware/software image signal processor (ISP) to obtain the final output signals which are typically display-referred and often in standard color spaces such as sRGB, P3, Bt2020, etc. Final output signals are typically compressed and stored in standard image/video file formats such as JPEG, MPEG, AVC, HEVC, etc.

Most camera's image sensors record color and intensity variations across the real scene; relatively few respond to polarization of light from the scene—and most of those use a single polarization filter and fail to map differences in polarization across the scene. We desire to determine a full Stokes vector of light received at each macropixel of an image sensor, so that a Mueller matrix of polarization changes induced by each portion of objects in the scene can be determined. To do so, we desire to determine polarization percentage and intensity in each of horizontal, vertical, 45-degree, right circular, and left circular polarizations. Scenes of rocks illuminated with polarized light can be analyzed to map different minerals in those rocks, or scenes of biological tissues illuminated with polarized light can be analyzed to map possible tumor in those biological tissues.

We have disclosed conductive nanowire linear polarizers in other patent applications that can be used on pixels of image sensors to selectively admit horizontal, vertical, or 45-degree polarized light. These linear polarizers comprise parallel nanowires oriented to preferentially pass light of a preferred linear polarization while blocking a majority of light of a polarization perpendicular to the preferred linear polarization.

Figure 1B:
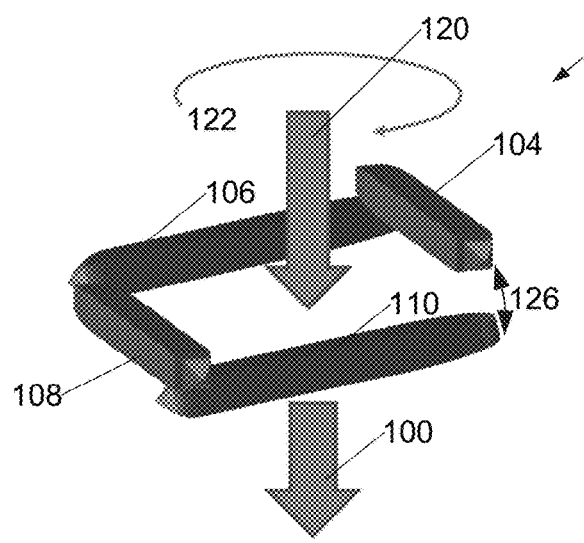
FIG. 1B is a schematic illustration of a circular polarizer formed of a descending spiral of four nanowires with circularly polarized light rotating through the polarizer against the direction of the spiral.
Figure 1A:
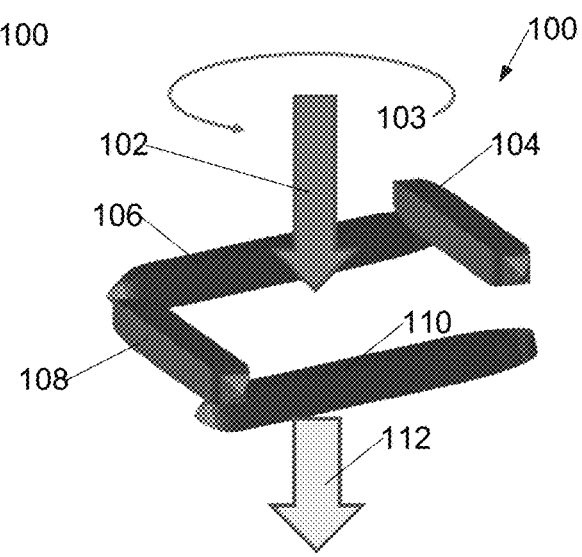
FIG. 1A is a schematic illustration of a circular polarizer formed of a descending spiral of four nanowires with circularly polarized light rotating through the polarizer in the same direction as the spiral.

In order to provide selectivity between left circular and right circular light, we use in an embodiment a spiral nanowire circular polarizer 100 (FIGS. 1A & 1B). Upon receiving incoming light 102 circularly polarized in the same direction 103 as a spiral formed by a first 104, second 106, third 108, and fourth 110 nanowire at successive levels of polarizer 100, light 112 leaving the polarizer is largely blocked. If incoming light 120 is circularly polarized in the opposite direction 122 as the spiral formed by the nanowires, light 124 leaving the polarizer is not attenuated. The spiral has a pitch 126 approximately one turn per wavelength of the incoming light 102, 120. The nanowires are formed in a transparent background material such as an oxide. First nanowire 104, or metal rod, is formed in a top layer of metal, the first nanowire having an end electrically contacting a first end of second nanowire 106 oriented at right angles to the first nanowire 104 and formed in a second layer of metal beneath the top layer of metal, the second nanowire 106 having a second end electrically contacting a first end of a third nanowire 108 oriented at right angles to the second nanowire and formed in a third layer of metal beneath the second nanowire 106, the third nanowire 108 having a second end electrically contacting an end of fourth nanowire 110 formed in a fourth layer of metal beneath the third nanowire. The first, second, third, and fourth nanowires form four sides of a square spiral with the fourth nanowire being at a lower level than the first nanowire with pitch approximating a wavelength of light in the transparent background material.

Figure 2:
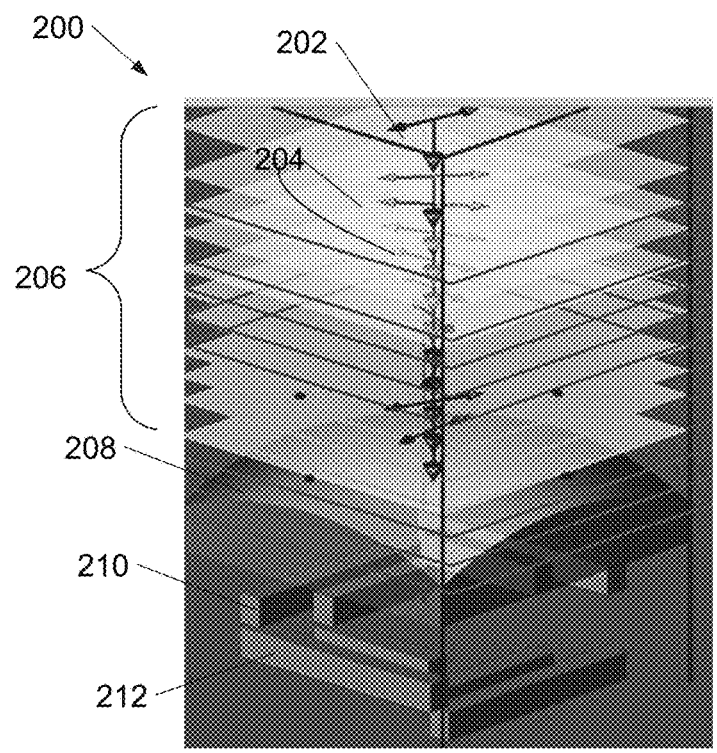
FIG. 2 is a schematic illustration of incoming light passing through a microlens and descending double-spiral circular polarizer of FIG. 1A.

FIG. 2 is a schematic illustration of an embodiment 200 with incoming light 202, the rotation of the electric field of the circularly polarized light is shown as a vector in successive imaginary planes 206. Light 202 passing through a microlens 208 and a circular polarizer 210 formed of nanowires 212. In a particular embodiment, the circular polarizer is the single spiral of nanowires illustrated in FIG. 1A or FIG. 1B, in another particular embodiment, circular polarizer 210 is formed of two concentric square spirals, each similar to those illustrated in FIG. 1A, 1B, as shown in FIG. 2.

Figure 3:
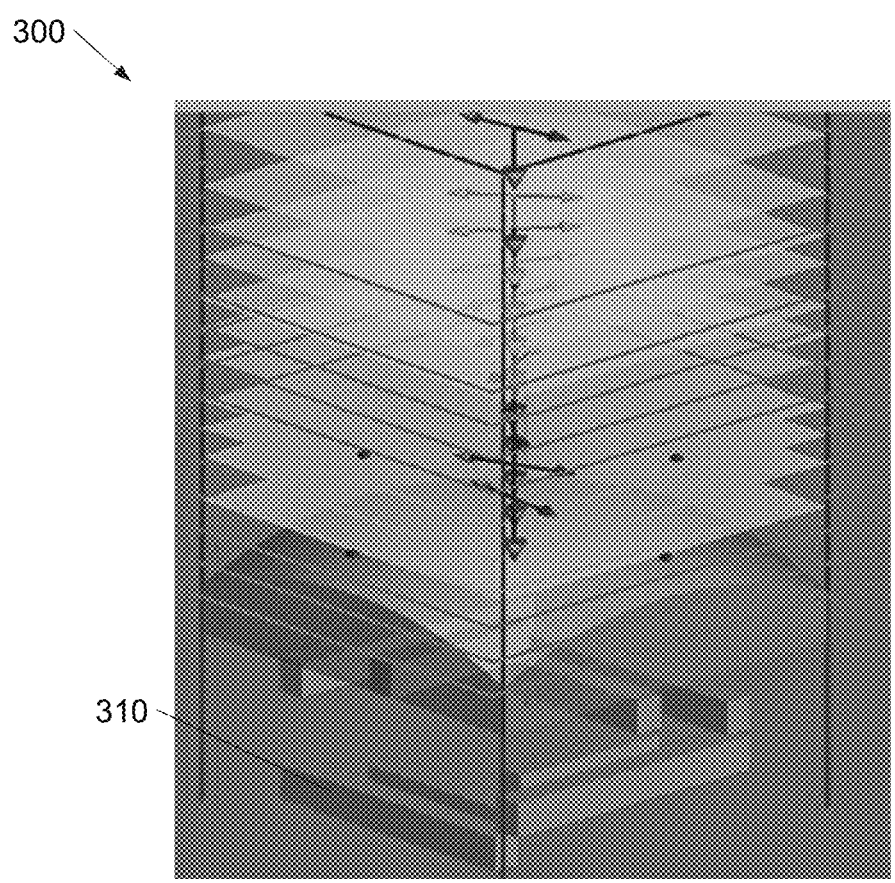
FIG. 3 is a schematic illustration of incoming light passing through a microlens and a reverse-direction descending double-spiral circular polarizer from that of FIG. 2.

We can build the circular polarizer with either a right-hand rotation to pass left hand polarized light as shown in FIGS. 1A, 1B, and 2, or we can build the circular polarizer 310 with a left-hand rotation to pass right hand polarized light as shown in FIG. 3.

In an embodiment, the circular polarizers of FIGS. 1A, 1B, 2, and 3 are formed of fifty nanometer wide and fifty nanometer thick aluminum nanowires. In alternative embodiments, the nanowires are between forty and sixty nanometers wide thus being about fifty nanometers wide.

In an embodiment, 400 (FIG. 4), the light-admitting surface of an image sensor is tiled with patterns of nine photodiodes, each photodiode having a different filter pattern. In a particular pattern intended to provide a full Stokes vector and color for incoming light at each photodiode group, one photodiode has a diagonal polarizer 402 formed of several parallel diagonal nanowires, another has a vertical polarizer 404 formed of several parallel vertical nanowires, another has a horizontal polarizer 406 formed of several parallel horizontal nanowires, another has a left circular polarizer 408 formed of one, two, or more concentric spirals of nanowires, another has a right circular polarizer 410 formed of several formed of one, two, or more concentric spirals of nanowires, another has a one of a clear, neutral density, or infrared filter 412, in some embodiments clear, neutral density, or infrared filter 412 may be replaced by a left diagonal polarizer oriented to pass light with polarization perpendicular to light passed by diagonal polarizer 402. Another has a blue filter 414, another has a green 416 filter, and another in red 418; the filters illustrated in FIG. 4 may appear in any order in the tiling pattern however the tiling pattern is reproduced throughout the image sensor surface permitting resolving polarization and color anywhere in an image acquired with the image sensor.

Figure 4:
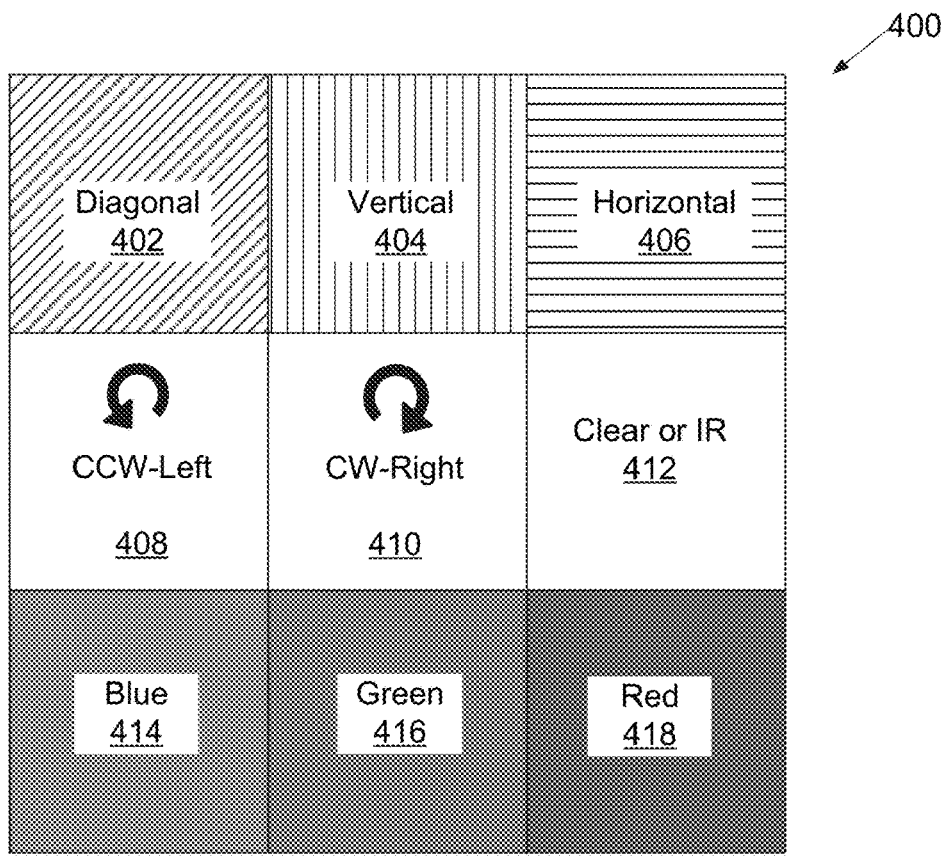
FIG. 4 is a schematic illustration of a tiling pattern of multiple polarizers of an image sensor using the polarizers of FIGS. 1A, 1B, 2 and 3 to determine a full Stokes vector of light arriving at a photodiode group or pixel.

In an embodiment of FIG. 4, with descending spiral nanowire circular polarizers, the left circular polarizer 408 passes less than half of right polarized light while passing essentially all of left polarized light; it is therefore referred to as preferentially passing left or counterclockwise polarized light. Further, the right circular polarizer 410 passes less than half of left polarized light while passing essentially all of right polarized light and is referred to as preferentially passing right or clockwise polarized light. With the horizontal, vertical, and 45-degree polarizers it can essentially resolve all polarizations needed to determine a full Stokes vector, and thus determine a full Mueller matrix of objects illuminated with polarized light. The horizontal and vertical polarizers are oriented with perpendicular polarizations.

Figure 5:
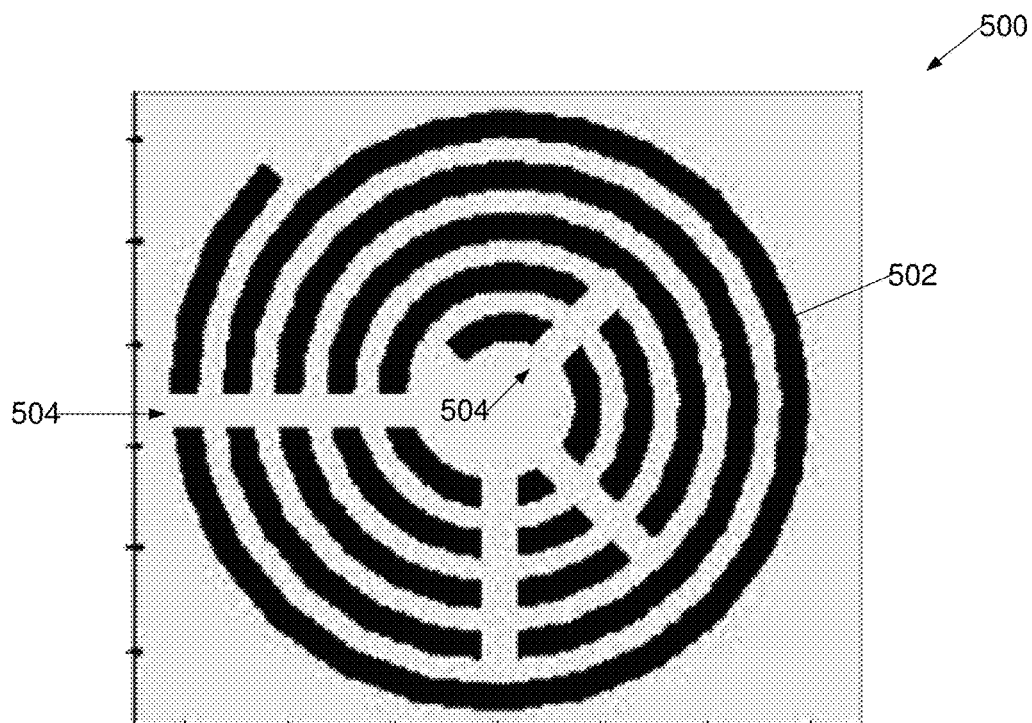
FIG. 5 is a schematic illustration of an alternative embodiment with a flat spiral circular polarizer.
Figure 12:
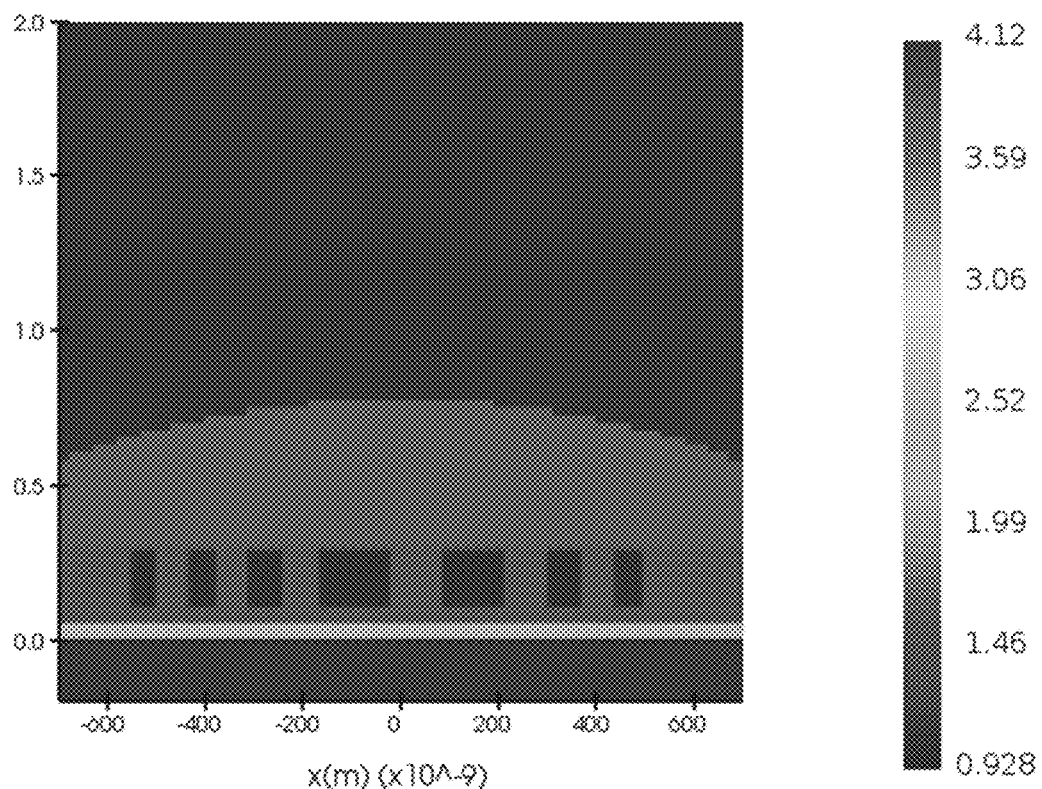
FIG. 12 is a cross sectional diagram of a flat spiral nanowire circular polarizer as described with reference to FIG. 5.

In another embodiment, we use a metal nanowire flat spiral circular polarizer 500 (FIG. 5, illustrated in top plan view; FIG. 12 illustrates a cross section of a metal nanowire flat spiral circular polarizer) having metal lines 502 approximately two hundred nanometers thick and about seventy nanometers wide, being between sixty and eighty nanometers in width. In all embodiments, including the embodiments of FIGS. 1A, 1B, 2, and 3, the metal lines 502 or nanowires are less than eighty nanometers wide. The metal lines 502 are interrupted by cuts 504. In some embodiments, the flat spiral circular polarizer 500 also serves as a diffractive lens. The flat spiral circular polarizer 500 offers advantage in that only a single metal-deposit-mask-and-etch sequence is necessary to form it, while the descending spiral circular polarizer of FIGS. 1A, 1B, 2 and 3 requires multiple such steps using multiple different masks.

In embodiments 600 (FIG. 6) with the flat spiral circular polarizer 500, 602 with cuts 504, it has been shown that light passing through the polarizer into photodiodes 604, 606, 608 diffracts into patterns significantly different for different polarizations of incoming light. FIGS. 7A, 7B, 7C, and 7D are schematic illustrations of diffraction patterns produced by the circular polarizer of FIG. 5, under linearly polarized incoming light, as generated in the embodiment of FIG. 6. FIG. 7A illustrates diffraction patterns with zero-degree polarization, FIG. 7B with right-45-degree polarization, FIG. 7C with 90-degree polarization, and FIG. 7D with left-45-degree polarization. These patterns are distinct, so it is possible to discriminate between them in embodiments with square patterns of four or nine photodiodes by ratioing light intensities as received by various photodiodes in the square pattern of photodiodes.

Figure 6:
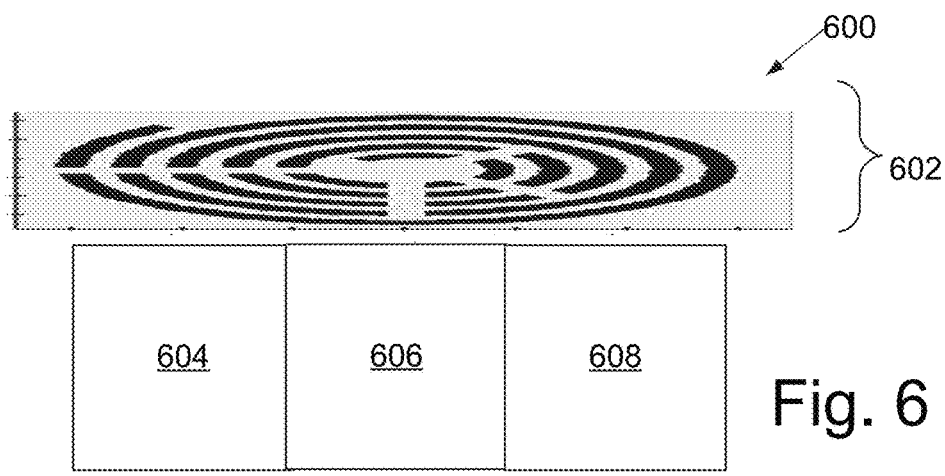
FIG. 6 is a schematic illustration of an embodiment where a single polarizer disperses light into different patterns of photodiode illumination for each polarization and permitting determination of linear as well as circular polarization of incoming light.
Figures 8A, 8B:
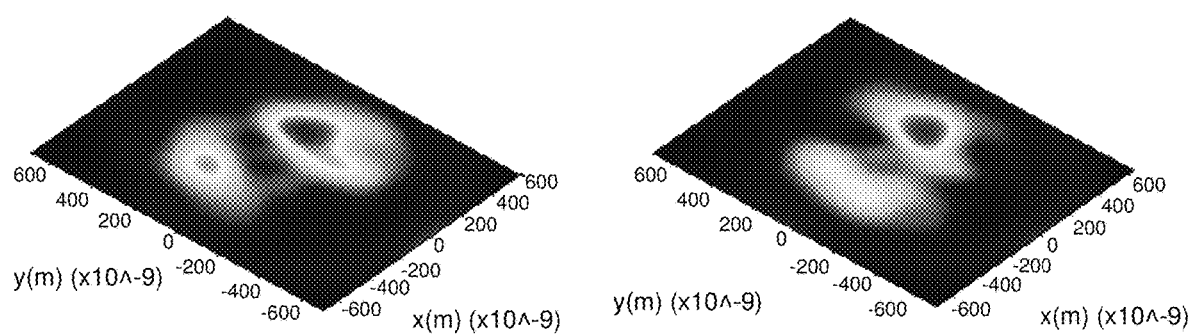
FIGS. 8A and 8B are schematic illustrations of diffraction patterns produced by the circular polarizers of FIG. 5, as generated in the embodiment of FIG. 6, under circularly polarized light.
Figure 7B:
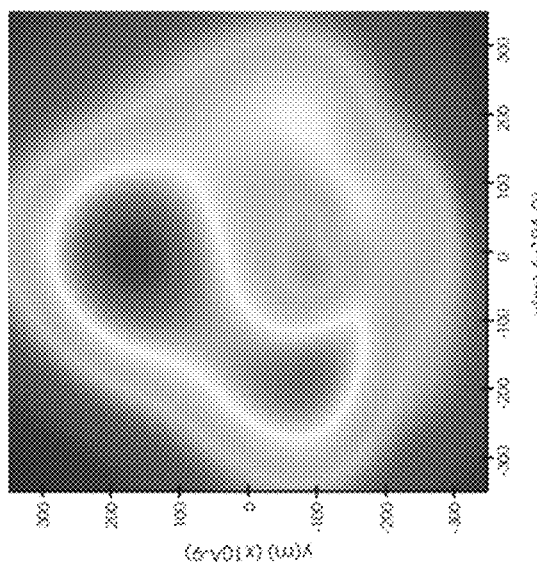
FIGS. 7A, 7B, 7C, and 7D are schematic illustrations of diffraction patterns produced by the circular polarizers of FIG. 5, as generated in the embodiment of FIG. 6.
Figure 7D:
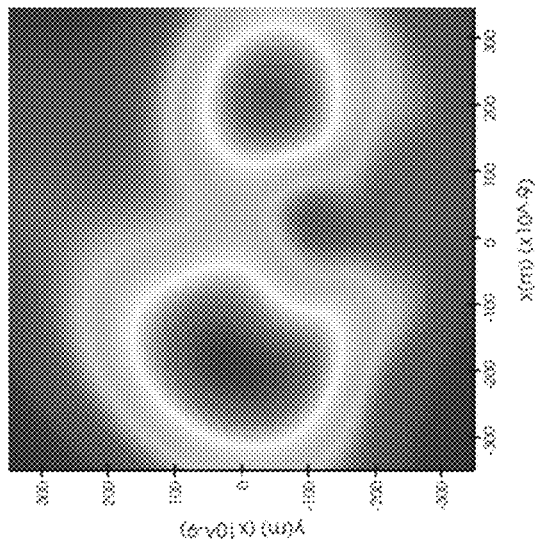
Figure 7A:
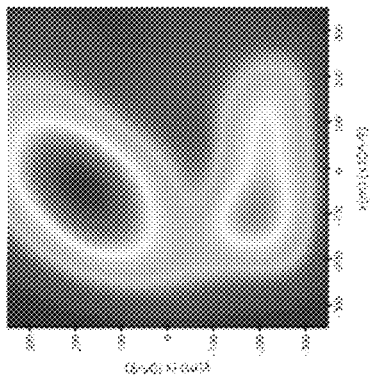
Figure 7C:
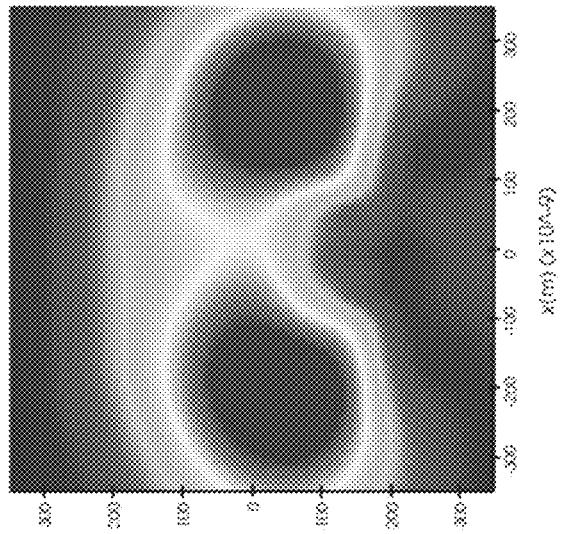

FIG. 8A is a schematic illustration of diffraction patterns produced by the circular polarizers of FIG. 5 under left or counterclockwise polarized light, as generated in the embodiment of FIG. 6. FIG. 8B is a schematic illustration of diffraction patterns produced by the circular polarizers of FIG. 5, as generated in the embodiment of FIG. 6, under right or clockwise circularly polarized light.

Figure 9:
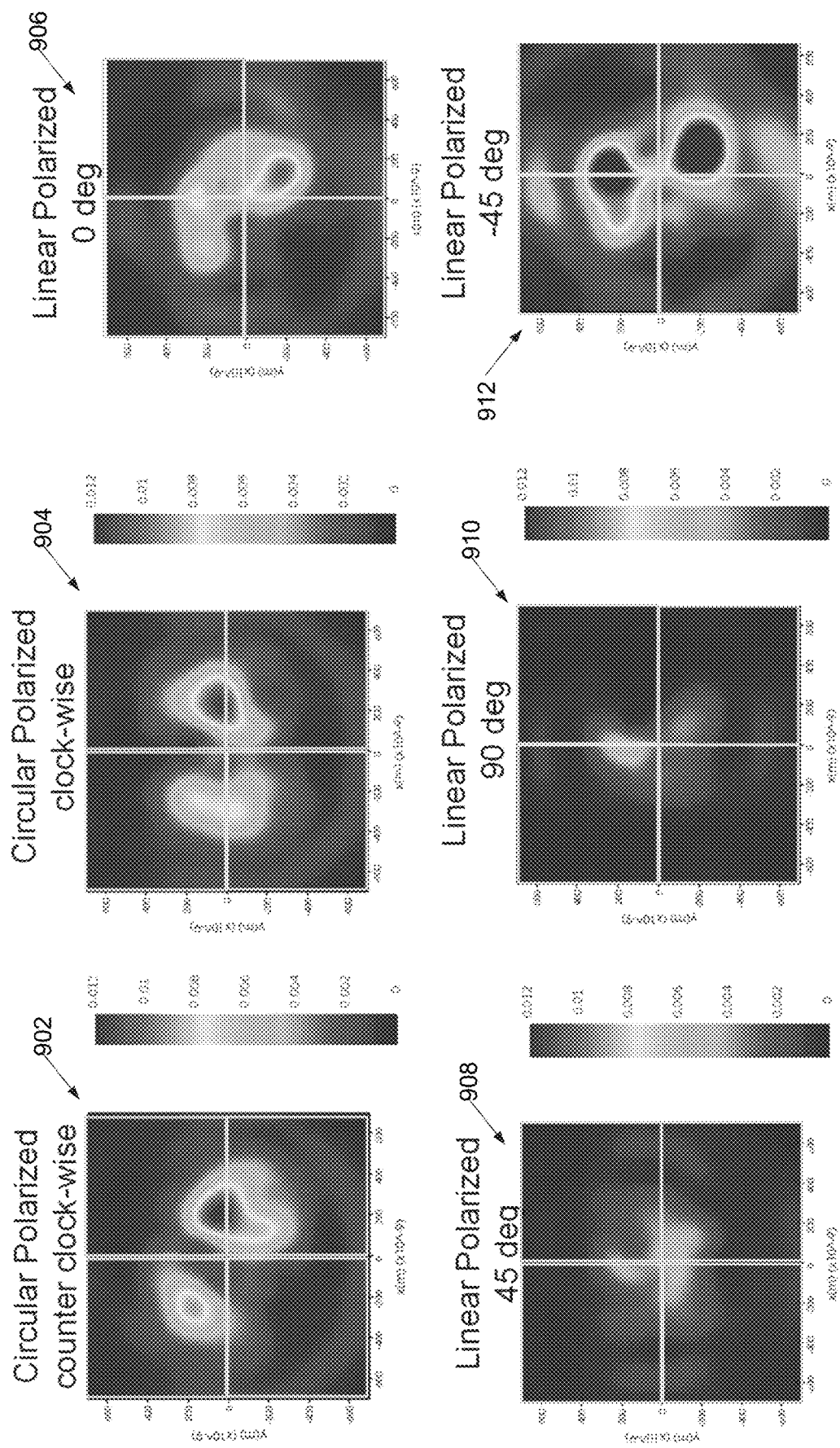
FIG. 9 is an illustration of all six diffraction patterns produced by the circular polarizer of FIG. 5 shown on an array of four photodiodes resembling the embodiment of FIG. 6.

FIG. 9 is an illustration of six diffraction patterns produced by the circular polarizer of FIG. 5 shown on an array of four photodiodes resembling the embodiment of FIG. 6, pattern 902 is a diffraction pattern produced by left or counterclockwise polarized light, pattern 904 is a diffraction pattern produced by right or clockwise polarized light, pattern 906 is a diffraction pattern produced by linear polarized light at an axis of zero degrees, pattern 908 is a diffraction pattern produced by linear polarized light at an axis of 45 degrees, pattern 910 is a diffraction pattern produced by linear polarized light at an axis of ninety degrees, and pattern 912 is a diffraction pattern produced by linear polarized light at an axis of −45 degrees.

FIG. 10 is an illustration of ratios, and totals, of signals received by four photodiodes in an array of four photodiodes resembling the embodiment of FIG. 6. Inspecting the ratios show they are distinct for each of the six polarizations, permitting a processor fed with signals from the four photodiodes to distinguish between the polarizations. An image sensor may be equipped with a processor that determines and analyzes these ratios and determines therefrom a Stokes vector associated with incoming light received by the flat spiral circular polarizer.

Figure 11:
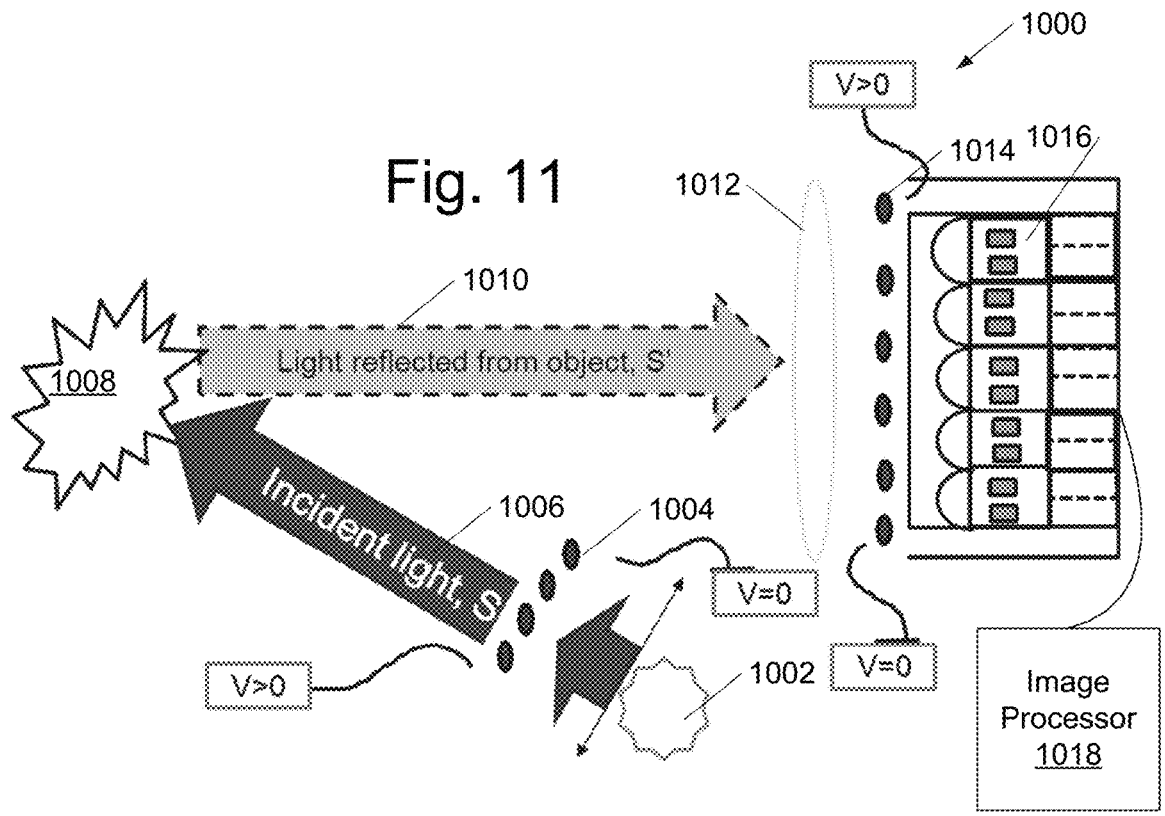
FIG. 11 illustrates an embodiment of a system configured to determine a Mueller matrix image of an object using an image sensor according to the embodiment of FIG. 4 or FIG. 9.

A system 1000 (FIG. 11) using the image sensors herein described FIG. 10 has a light source 1002 that provides an illumination beam 1006 through an illumination polarizer 1004. Beam 1006 illuminates a target 1008, and light 1010 from target 1008 passes through an imaging lens 1012 onto the image sensor herein described with circular polarizers either of FIGS. 1A, 1B, 2, 3, or FIG. 5, where arrayed circular polarizers 1014 and photodiodes 1016 of the image sensor are coupled through sense amplifiers (not shown for simplicity) to form an electronic image. A processor 1018 receives the electronic image and is configured to analyze polarization of light 1010 from the target providing images of polarization, such as images of particular Stokes vector parameters, of light 1010 and/or images of Mueller matrix parameters of target 1008.

In a particular embodiment of system 1000, light source 1002 and polarizer 1004 are a light emitting diode and polarizer mounted on a distal end of an endoscope. Target 1008 is suspect tissue within a body. Lens 1012, circular polarizers 1014, and photodiodes 1016 of the image sensor are all also mounted on the distal end of an endoscope, while image processor 1018 and displays driven by processor 1018 are suitable for presenting images representing polarization of light received from the target to a physician are located at a proximal end of the endoscope.

Combinations

An image sensor designated A includes an array of a tiling pattern of cells, each cell having at least one spiral nanowire circular polarizer formed of nanowires less than 80 nanometers in width; and at least one photodiode disposed to receive incoming light after that incoming light passes through the at least one spiral nanowire circular polarizer.

An image sensor designated AA including the image sensor designated A wherein the spiral nanowire circular polarizer is a descending spiral circular polarizer comprising at least one spiral of four nanowires each about fifty nanometers wide, each of the four nanowires at a successive level in the descending spiral circular polarizer.

An image sensor designated AAA including the image sensor designated A or AA wherein the tiling pattern comprises a first spiral nanowire circular polarizer configured to preferentially pass clockwise polarized light, and a second spiral nanowire circular polarizer configured to preferentially pass counterclockwise polarized light.

An image sensor designated AAB including the image sensor designated A, AA, or AAA wherein the tiling pattern further comprises at least two linear polarizers including a first linear polarizer oriented to preferentially pass light with polarization perpendicular to light preferentially passed by a second linear polarizer.

An image sensor designated AAC including the image sensor designated A, AA, AAA, or AAB wherein each spiral nanowire circular polarizer comprises at least two concentric spirals of four nanowires.

An image sensor designated AB including the image sensor designated A, wherein the spiral nanowire circular polarizer comprises a flat spiral nanowire of width about seventy nanometers width, the flat spiral nanowire being interrupted by cuts.

An image sensor designated ABA including the image sensor designated A or AB wherein the spiral nanowire circular polarizer is configured to serve as a diffractive lens.

An image sensor designated ABB including the image sensor designated A, ABA, or AB wherein the spiral nanowire circular polarizer is disposed over at least four photodiodes, the at least four photodiodes configured to read a diffraction pattern formed by light passing through the spiral nanowire circular polarizer.

An image sensor designated ABC including the image sensor designated ABB further comprising a processor configured to compute ratios of signals provided by the at least four photodiodes and to determine polarization of light therefrom.

An imaging system designated B includes a light source and illumination polarizer configured to illuminate a target; and a lens configured to image light from the target onto the image sensor designated A, AA, AB, AAA, AAB, AAC, ABA, ABB, or ABC, the image sensor coupled to provide an electronic image to a processor; where the processor is configured to analyze polarization of the light from the target.

A method designated C of imaging an object includes passing light from the object through a spiral nanowire circular polarizer, the spiral nanowire polarizer comprising nanowires less than eighty nanometers wide; receiving the light from the object into photodiodes of an image sensor to generate an electronic image; and processing the electronic image into an image representing polarization of the light from the object.

A method designated CA including the method designated C wherein the spiral nanowire circular polarizer is a descending spiral circular polarizer comprising at least one spiral of four nanowires each about fifty nanometers wide, each of the four nanowires at a successive level in the descending spiral circular polarizer.

A method designated CB including the method designated C where the spiral nanowire circular polarizer has a flat spiral nanowire of width about seventy nanometers width, the flat spiral nanowire being interrupted by cuts; the spiral nanowire circular polarizer is configured to serve as a diffractive lens; and the spiral nanowire circular polarizer is disposed over at least four photodiodes, the at least four photodiodes configured to read a diffraction pattern formed by light passing through the spiral nanowire circular polarizer.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An image sensor comprising an array of a tiling pattern of cells, each cell comprising:
   at least one spiral nanowire circular polarizer comprising nanowires less than 80 nanometers in width; and
   at least one photodiode disposed to receive incoming light after that incoming light passes through the at least one spiral nanowire circular polarizer;
   wherein the at least one spiral nanowire circular polarizer is a descending spiral circular polarizer comprising at least one spiral of four nanowires each about fifty nanometers wide, each of the four nanowires at a successive level in the descending spiral circular polarizer.

2. The image sensor of claim 1, wherein the tiling pattern of cells comprises a first spiral nanowire circular polarizer configured to preferentially pass clockwise polarized light, and a second spiral nanowire circular polarizer configured to preferentially pass counterclockwise polarized light.

3. The image sensor of claim 2, wherein the tiling pattern of cells further comprises at least two linear polarizers including a first linear polarizer oriented to preferentially pass light with polarization perpendicular to light preferentially passed by a second linear polarizer.

4. The image sensor of claim 1, wherein each spiral nanowire circular polarizer comprises at least two concentric spirals of four nanowires.

5. The image sensor of claim 4, wherein the tiling pattern of cells comprises a first spiral nanowire circular polarizer configured to preferentially pass clockwise polarized light, and a second spiral nanowire circular polarizer configured to preferentially pass counterclockwise polarized light.

6. The image sensor of claim 5, wherein the tiling pattern of cells further comprises at least two linear polarizers including a first linear polarizer oriented to preferentially pass light with polarization perpendicular to light preferentially passed by a second linear polarizer.

7. An imaging system comprising:
   a light source and illumination polarizer configured to illuminate a target; and
   a lens configured to image light from the target onto the image sensor of claim 1, the image sensor coupled to provide an electronic image to a processor;
   where the processor is configured to analyze polarization of the light from the target;
   wherein the at least one spiral nanowire circular polarizer is a descending spiral circular polarizer comprising at least one spiral of four nanowires each about fifty nanometers wide, each of the four nanowires at a successive level in the descending spiral circular polarizer.

8. The imaging system of claim 2, wherein the tiling pattern of cells comprises a first spiral nanowire circular polarizer configured to preferentially pass clockwise polarized light, and a second spiral nanowire circular polarizer configured to preferentially pass counterclockwise polarized light.

9. The imaging system of claim 8, wherein the tiling pattern of cells further comprises at least two linear polarizers including a first linear polarizer oriented to preferentially pass light with polarization perpendicular to light preferentially passed by a second linear polarizer.

10. The imaging system of claim 2, wherein the at least one spiral nanowire circular polarizer is configured to serve as a diffractive lens.

11. An image sensor comprising an array of a tiling pattern of cells, each cell comprising:
    at least one spiral nanowire circular polarizer formed of nanowires less than 80 nanometers in width; and
    at least one photodiode disposed to receive incoming light after that incoming light passes through the at least one spiral nanowire circular polarizer;
    wherein the at least one spiral nanowire circular polarizer comprises a flat spiral nanowire of width about seventy nanometers width, the flat spiral nanowire being interrupted by cuts;
    wherein the at least one spiral nanowire circular polarizer is configured to serve as a diffractive lens;
    wherein the at least one spiral nanowire circular polarizer is disposed over at least four photodiodes, the at least four photodiodes configured to read a diffraction pattern formed by light passing through the at least one spiral nanowire circular polarizer.

12. The image sensor of claim 11, further comprising a processor configured to compute ratios of signals provided by the at least four photodiodes and to determine polarization of light therefrom.

13. A method of imaging an object comprising:
    passing light from the object through a spiral nanowire circular polarizer, the spiral nanowire polarizer comprising nanowires less than 80 nanometers wide;
    receiving the light from the object into photodiodes of an image sensor to generate an electronic image; and
    processing the electronic image into an image representing polarization of the light from the object;
    wherein the spiral nanowire circular polarizer is a descending spiral circular polarizer comprising at least one spiral of four nanowires each about fifty nanometers wide, each of the four nanowires at a successive level in the descending spiral circular polarizer.

14. A method of imaging an object comprising:
    passing light from the object through a spiral nanowire circular polarizer, the spiral nanowire polarizer comprising nanowires less than eighty nanometers wide;

receiving the light from the object into photodiodes of an image sensor to generate an electronic image; and processing the electronic image into an image representing polarization of the light from the object;

wherein:

the spiral nanowire circular polarizer comprises a flat spiral nanowire of width about seventy nanometers width, the flat spiral nanowire being interrupted by cuts;

the spiral nanowire circular polarizer is configured to serve as a diffractive lens; and the spiral nanowire circular polarizer is disposed over at least four photodiodes, the at least four photodiodes configured to read a diffraction pattern formed by light passing through the spiral nanowire circular polarizer.

* * * * *